(12) United States Patent
Sheridan et al.

(10) Patent No.: US 12,154,940 B1
(45) Date of Patent: Nov. 26, 2024

(54) STACKED STAGGERED ELECTRODE FOIL CAPACITOR STRUCTURES IN SEMICONDUCTOR DEVICES FOR SINGLE AND MULTI-VOLTAGE DOMAIN APPLICATIONS AND METHOD OF FABRICATION

(71) Applicant: Saras Micro Devices, Inc., Chandler, AZ (US)

(72) Inventors: Richard P. Sheridan, Gilbert, AZ (US); Courtney Timms, Canton, GA (US)

(73) Assignee: Saras Micro Devices, Inc., Chandler, AZ (US)

( * ) Notice: Subject to any disclaimer, the term of this patent is extended or adjusted under 35 U.S.C. 154(b) by 0 days.

(21) Appl. No.: 18/444,455

(22) Filed: Feb. 16, 2024

(51) Int. Cl.
*H01L 25/04* (2023.01)
*H01L 21/768* (2006.01)
*H01L 23/00* (2006.01)
*H01L 23/532* (2006.01)
*H01L 49/02* (2006.01)

(52) U.S. Cl.
CPC ........ *H01L 28/91* (2013.01); *H01L 21/76873* (2013.01); *H01L 23/53228* (2013.01); *H01L 24/97* (2013.01); *H01L 25/04* (2013.01); *H01L 28/87* (2013.01); *H01L 2224/97* (2013.01)

(58) Field of Classification Search
CPC ............... H01L 28/91; H01L 21/76873; H01L 23/53228; H01L 24/97; H01L 25/04; H01L 28/87; H01L 2224/97
USPC ........................................................ 257/532
See application file for complete search history.

(56) References Cited

U.S. PATENT DOCUMENTS

| 2003/0096498 | A1* | 5/2003 | Chopra | H01L 21/76879 438/759 |
| 2005/0219802 | A1* | 10/2005 | Kobayashi | H01G 9/0032 361/523 |
| 2007/0059584 | A1* | 3/2007 | Nakano | H01M 4/134 204/290.01 |
| 2020/0328031 | A1* | 10/2020 | Wu | H01G 4/008 |
| 2023/0006788 | A1 | 1/2023 | Dai et al. | |
| 2023/0067888 | A1 | 3/2023 | Sundaram et al. | |
| 2023/0369730 | A1* | 11/2023 | Oh | H01M 10/0525 |

OTHER PUBLICATIONS

Micromachines. "Focused Electron Beam-Based 3D Nanoprinting for Scanning Probe Microscopy: A Review;" Harold Plank et al.; http://www.mdpi.com/journal/micromachines.

* cited by examiner

*Primary Examiner* — Duy T Nguyen
(74) *Attorney, Agent, or Firm* — Stetina Brunda Garred & Brucker (57) ABSTRACT

A stacked staggered electrode capacitor in semiconductor devices and methods for fabrication. There are capacitor elements each with a cathode vertically disposed relative to an anode, an anode conductive plating on the anode and a cathode conductive plating on the anode. The anode conductive plating is in a laterally offset relationship to the cathode conductive plating. The plurality of capacitor elements are stacked onto another. One or more build-up layers are interposed between the capacitor elements. One or more anode connecting electrode segments are on a first side of the plurality of capacitor elements, and a cathode connecting electrode on an opposed second side of the plurality of capacitor elements is connected to the cathode conductive plating of each of the plurality of capacitor elements.

18 Claims, 9 Drawing Sheets

STACKED STAGGERED ELECTRODE FOIL CAPACITOR STRUCTURES IN SEMICONDUCTOR DEVICES FOR SINGLE AND MULTI-VOLTAGE DOMAIN APPLICATIONS AND METHOD OF FABRICATION

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Technical Field

The present disclosure relates generally to passive electronic devices. More specifically, the present disclosure relates to capacitors in semiconductor devices with stacked staggered-electrode foil structures for single and multi-voltage domain applications, and methods of fabricating the same.

2. Related Art

Capacitors are an important part of many integrated and embedded circuits and are commonly used as energy storage structures, as primary components in filters and other signal conditioning applications, and as specific components of other types of complex integrated circuits. Capacitors are commonly arranged as a pair of opposing thin electrodes separated by a dielectric, with electrical energy being stored as a consequence of equal and opposite charges on the opposing electrodes. Higher capacitance values may be achieved by a greater surface area of the electrode.

A wide variety of configurations of capacitors as well as packaging modalities are known in the art. In one basic configuration, the electrode and dielectric may be rolled into a tight cylindrical structure to optimize the surface area per unit volume. Another configuration may utilize deep trenches in silicon to benefit from more surface area, or as layers of dielectric and metal stacked and connected to each other. Efforts to maximize capacitance and minimize equivalent series resistance (ESR) of capacitors have led to the development of double-sided capacitors such as those described in co-owned U.S. Pat. App. Pub. No. 2023/006788, entitled "Planar High-Density Aluminum Capacitors for Stacking and Embedding," the entirety of the disclosure of which is incorporated by reference herein. A double-sided capacitor in accordance with the teachings of the disclosure may define a second electrode, e.g., a cathode, of a conductive polymer, metal, or ceramic that is disposed on both sides of a first electrode, e.g., an anode of aluminum that has been etched or otherwise modified to have a high surface area. An oxide layer may be formed between the first and second electrodes to serve as the dielectric.

One common structure for stacking solid polymer aluminum foil capacitive elements includes a cathode structure that is wrapped around an inner aluminum core anode, with a portion of the aluminum core anode being left untreated or uncoated and extending out from the cathode-wrapped inner aluminum core. This structure requires the use of conductive pastes as well as aluminum welding techniques to join and stack the anode and cathode elements before encapsulation. The reduction of resistance in the inter-element and electrode-to-terminal connections is therefore limited. Such conventional structures are limited in electrode area efficiency and volumetric capacitive density, particularly in advanced substrate core embedding applications with thinner form factors. These conventional structures are also limited to the fabrication of single discrete capacitive elements and are not suitable for integrated passive devices nor can multiple voltage domains be serviced with the single device.

Accordingly, there is a need in the art for stacked staggered-electrode structures based on solid conductive polymer foil capacitive elements. There is also a need for a higher effective electrode area and increased volumetric capacitive density. Such structures should also be suitable for integrated passive devices that can be embedded into advanced packaging substrates having higher power efficiency architectures that are needed for high power devices.

BRIEF SUMMARY

A stacked staggered electrode capacitors and methods for fabricating the same are disclosed. Solid-conductive polymer foil-based capacitive elements are utilized, resulting in higher effective electrode area and increased volumetric capacitive density. Co-joined capacitive elements may have common cathodes and discrete anodes suitable for implementation in integrated passive devices serving multiple independent voltage domains. Copper plating in electrode to terminal connections reduces equivalent series resistance, thus increasing power efficiency and reducing thermal load. With top and bottom copper plated terminals, the integrated passive devices may be embedded into advanced packaging substrates supporting high power efficiency architectures needed for high power devices.

According to one embodiment of the present disclosure, there may be a stacked staggered electrode capacitor. The capacitor may have an anode that is defined by an anode first end and an opposed anode second end. The capacitor may also have a cathode that is disposed vertically relative to the anode and defined by a cathode first end substantially coterminous with the anode second end. The anode may also be defined by an opposed anode second end that is substantially coterminous with the anode first end. The capacitor may include a first conductive plating on the anode, which extends from beyond the anode first end toward the anode second end. Furthermore, the capacitor may have a second conductive plating on the cathode. The second conductive plating may extend from beyond the cathode second end toward the cathode first end. The second conductive plating may be in a staggered relationship relative to the first conductive plating.

Another embodiment of the present disclosure may be a stacked staggered electrode capacitor. The capacitor may include a plurality of capacitor elements each with a cathode disposed vertically relative to an anode. The capacitor element may also include an anode conductive plating on the anode and a cathode conductive plating on the anode. The anode conductive plating may be in a laterally offset relationship to the cathode conductive plating. The plurality of capacitor elements be stacked onto another. The capacitor may also include one or more build-up layers, each of which may be interposed between one of the plurality of capacitor elements and a vertically adjacent one of the plurality of capacitor elements. The capacitor may further include one or more anode connecting electrode segments on a first side of the plurality of capacitor elements, as well as a cathode connecting electrode on an opposed second side of the plurality of capacitor elements that is connected to the cathode conductive plating of each of the plurality of capacitor elements.

The embodiments of the present disclosure also include a method for fabricating a stacked staggered electrode capacitor. The method may include coating a conductive polymer cathode layer on to a planar anode sheet to form one or more capacitor core assemblies. Each of the capacitor core assemblies may be defined by an assembly top surface corresponding to a cathode and an assembly bottom surface corresponding to an anode. There may be a step of forming one or more vertical insulator channels that are spaced apart along the one of the capacitor core assemblies. The method may further include filling the vertical insulator channels with an insulator epoxy material. The method may also involve seed metallizing the assembly top surface and the assembly bottom surface to form a seeded cathode metal layer and a seeded anode metal layer. There may additionally be a step of plating the seeded cathode metal layer and the seeded anode metal layer to form a cathode electrode plating and an anode electrode plating. The method may include etching the cathode electrode plating and the anode electrode plating to respectively define a top opening and a bottom opening to the insulator epoxy material. The cathode electrode plating may be staggered relative to the anode electrode plating with the top opening being laterally offset from the bottom opening.

The method for fabricating the capacitor may also include a step of laminating a plurality of the capacitor core assemblies. Build-up layers may separate one of the capacitor core assemblies from another. Together, the capacitor core assemblies and the build-up layers may form a capacitor stack. The method may also include routing one or more slots through the capacitor stack at least partially coextensively with the top and bottom openings defined by the cathode electrode plating and the anode electrode plating of respective ones of the capacitor core assemblies. There may also be a step of metal plating the one or more slots. A cathode connecting electrode may be defined along a first side of one of the slots and electrically connected to the cathode electrode plating of at least one of the capacitor core assemblies. An anode connecting electrode may be defined along a second side of one of the slots and electrically connected to the anode electrode plating of at least one of the capacitor core assemblies.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of stacked staggered electrode foil capacitor structures for single and multiple domain applications and methods of their fabrication. It is not intended to represent the only form in which such embodiments may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second, top and bottom, left and right and the like are used solely to distinguish one from another entity without necessarily requiring or implying any actual such order or relationship between such entities.

Figure 1:
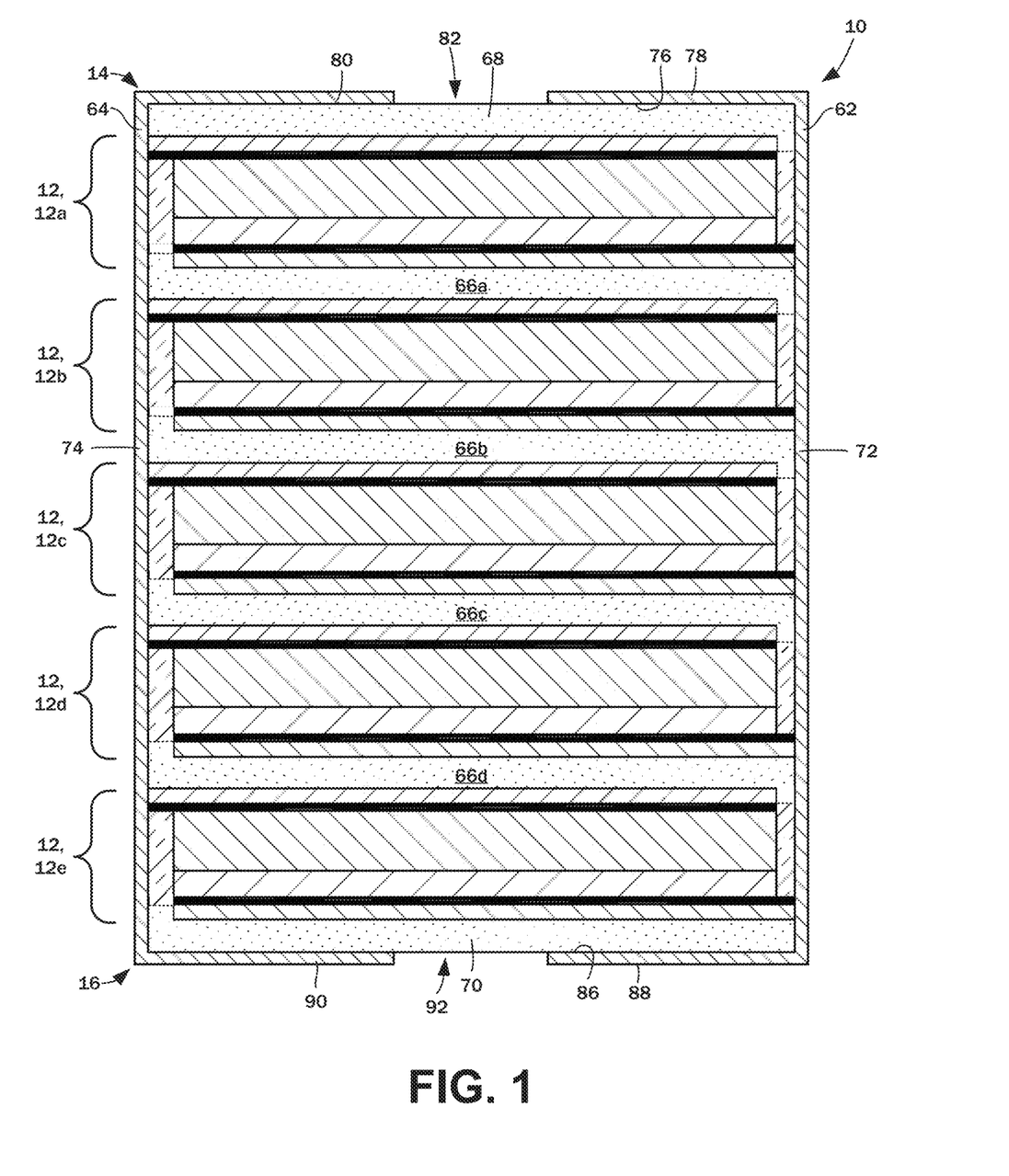
FIG. 1 is a cross-sectional view of an exemplary stacked staggered electrode foil capacitor according to one embodiment of the present disclosure.

Referring now to FIG. 1, various embodiments of the present disclosure contemplate a stacked staggered electrode foil capacitor 10, also referred to herein as capacitor 10, comprised of multiple capacitor elements 12 or capacitor core assemblies. In the illustrated example, there are five (5) capacitor elements stacked on top of each other, including a first capacitor element 12a at an uppermost end 14 of the capacitor 10, a second capacitor element 12b below the first capacitor element 12a, a third capacitor element 12c below the second capacitor element 12b, a fourth capacitor element 12d below the third capacitor element 12c, and a fifth capacitor element 12e at the lowermost end 16 of the capacitor 10. Notwithstanding the embodiment of FIG. 1 showing five capacitor elements 12, it is to be understood that this is by way of example only and not of limitation. Other embodiments may incorporate additional capacitor elements 12, or fewer capacitor elements 12.

Figure 2:
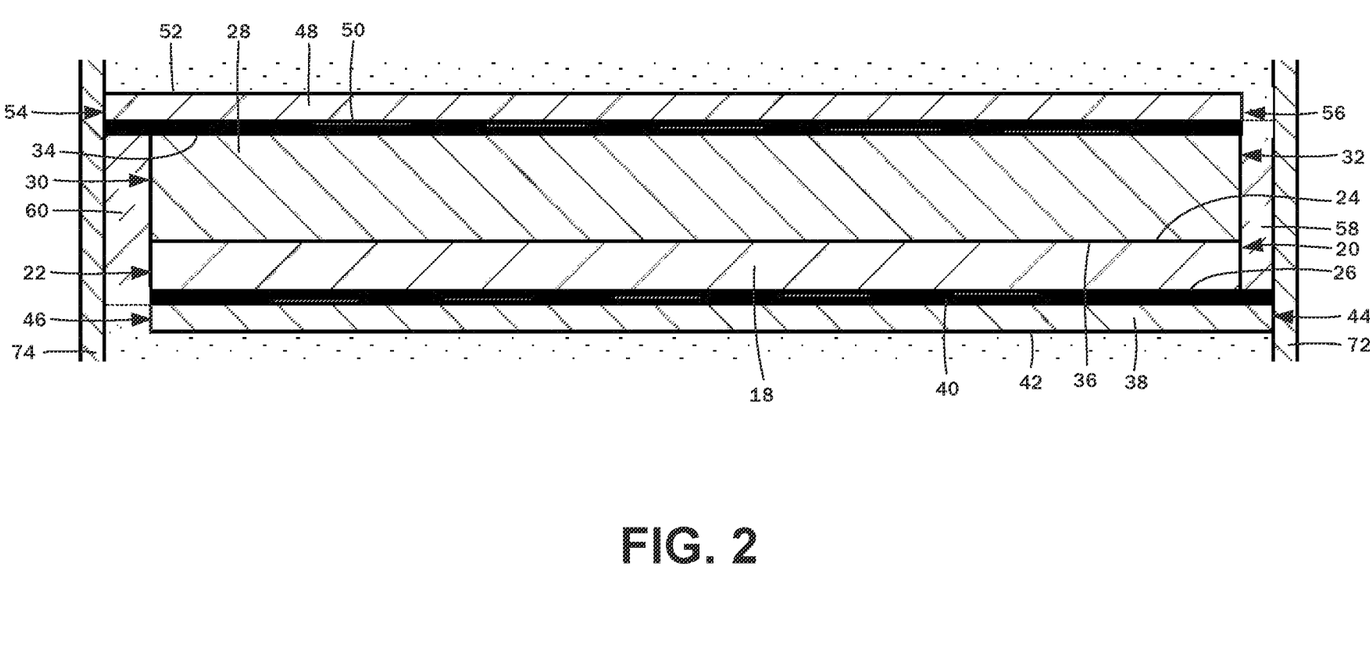
FIG. 2 is a detailed cross-sectional view of a capacitor element or core assembly incorporated into the stacked staggered electrode foil capacitor.

Each of the capacitor elements 12a-12e are understood to have the same configuration, and so for the purposes of brevity, additional features thereof will be described in the context of the first capacitor element 12a shown in further detail in FIG. 2. It is to be understood that such features are applicable to the remaining capacitor elements 12b-12e of the stacked staggered electrode foil capacitor 10. In further detail, the capacitor element 12 includes an anode 18 that has an elongate planar structure with an anode first end 20 and an opposed anode second end 22. Additionally, the elongated planar structure of the anode 18 is defined by an anode top surface 24 and an anode bottom surface 26. According to various embodiments, the anode 18 is an electrically conductive metal or metal alloy foil. Preferably, though optionally, the metal foil is aluminum, though any other suitable electrically conductive material may be substituted without departing from the present disclosure.

The capacitor element 12 further includes a cathode 28, which has an elongate planar structure with a cathode first end 30 and an opposed cathode second end 32. Although the anode 18 and the cathode 28 are depicted as two physically separate layers, it is to be understood that they are constructed from a single sheet of foil material. The cathode 28 is defined on the upper portion of the foil by the formation of a dielectric on an etched high surface area followed by conformal coating with a conductive polymer. Accordingly, the cathode 28 may be described as being vertically disposed relative to the anode 18 even though the anode 18 and the cathode 28 may be physically contiguous. The elongated planar structure of the cathode 28 has a cathode top surface 34 and a cathode bottom surface 36 that faces and is adjacent to the anode top surface 24. In other words, a connecting interface between the cathode 28 and the anode 18 is defined by the respective cathode bottom surface 36 and the anode top surface 24. These cathode bottom surface 36 and the anode top surface 24 depicted with clear boundaries herein solely for the purpose of distinguishing the anode 18 from the cathode, and it is not implied that a fabricated device will exhibit such clear physical boundaries. In this regard, the thickness of the anode 18 and the cathode 28, or the thickness ratio of the same, are not intended to be limited to that which is shown in the figures. The cathode first end 30 is substantially coterminous with the anode second end 22, while the cathode second end 32 is substantially coterminous with the anode first end 20. The cathode 28 is likewise understood to be a conductive material. Preferably, though optionally, this may be a polymer foil.

Generally, however, the selection of material for the anode 18 and the cathode 28 may be varied according to the desired capacitance and dielectric constant values for the particular capacitor element 12 and/or the overall stacked staggered electrode capacitor 10. Similarly, the thickness and lengthwise/widthwise dimensional parameters may also be varied according to the particular application and desired characteristics.

Each capacitor element 12 also has a first conductive plating 38 on the anode 18. With the orientation of the capacitor 10 shown in FIG. 1, the anode 18 appears stacked on to the first conductive plating 38, though as will be described in further detail below, a metal plating is applied to the anode bottom surface 26 following a seed metallization step. Accordingly, underneath the anode 18 is an anode conductive seed layer 40. As referenced herein, stacking refers generally to the top-to-bottom positional relationship of one component relative to another, such as the anode 18 being disposed above the first conductive plating 38 with the anode conductive seed layer 40 interposed between and is not limited to the physical placing of one component on top of another. Opposite the anode conductive seed layer 40, the first conductive plating 38 defines a bottom conductive plating surface 42 and extends from beyond the anode first end 20. More particularly, the first conductive plating 38 defines a first conductive plating first end 44 that is laterally offset from the anode first end 20. The first conductive plating 38 extends across the anode 18 and defines a first conductive plating second end 46 that is substantially coterminous with the anode second end 22 and the cathode first end 30. In accordance with various embodiments of the present disclosure, the first conductive plating 38 may be copper. It will be appreciated that the copper plating in the electrode-to-terminal connections such as that of the first conductive plating and the anode 18 yields a reduction in the equivalent series resistance of the capacitor 10 overall, which in turn increases power efficiency and reduces thermal load thereon.

Each capacitor element 12 further incorporates a second conductive plating 48 on the cathode 28.

With the orientation of the capacitor 10 shown in FIG. 1, the second conductive plating 48 appears stacked on to the cathode 28, but again, a metal plating is applied to the cathode top surface 34 following a seed metallizing step with a cathode conductive seed layer 50 being between the cathode 28 and the second conductive plating 48. Like the first conductive plating 38, the second conductive plating 48 is copper. Opposite the cathode conductive seed layer 50, the second conductive plating 48 defines a top conductive plating surface 52 and extends from beyond the cathode first end 30. The second conductive plating 48 defines a second conductive plating first end 54 that is laterally offset from the cathode first end 30. The second conductive plating 48 extends across the cathode 28 and defines a second conductive plating second end 56 that is substantially coterminous with the cathode second end 32 as well as the anode first end 20.

Because the first conductive plating 38 extends from beyond the right side bounds of the anode 18 and the cathode 28, and the second conductive plating 48 extends from beyond the left side bounds of the anode 18 and the cathode 28, the first conductive plating 38 is understood to be laterally offset or staggered relative to the second conductive plating 48. As will be described in further detail below, this permits interconnections of the first conductive plating 38 of one or more of the capacitor elements 12 on the right side, and the interconnections of the second conductive plating 48 of one or more of the capacitor element 12 on the left side. In the embodiments of the present disclosure, there is understood to be a vertical spacing of the first conductive plating 38 (also referred to as the anode terminal because of the connection to the anode 18) relative to the second conductive plating 48 (also referred to as the cathode terminal because of the connection to the cathode 28). The cathode terminal 48 being staggered or laterally offset to the anode terminal 38 means that each has a central region of overlap in the context of the vertically spaced or offset relationship, while each has extending regions without overlap in opposite directions. For example, the cathode terminal 48 extends to the left beyond the leftmost edge of the anode terminal 38, while the anode terminal 48 extends to the right beyond the rightmost edge of the cathode terminal 48.

Disposed to the right of the anode 18 and the cathode 28 in the intermediate vertical space bounded by the anode first end 20/cathode second end 32 and the first conductive plating first end 44 is a first insulator 58. Similarly, on the opposite side, disposed to the left of the anode 18 and the cathode 28 in the intermediate vertical space bounded by the anode second end 22/cathode first end 30 and the second conductive plating first end 54 is a second insulator 60. Both the first insulator 58 and the second insulator 60 may have a height or thickness that is equal to that of the stacked anode 18 and cathode 28. The first insulator 58 and the second insulator 60 may be a non-conductive polymer/epoxy material.

The first conductive plating 38 is structurally contiguous and in electrical communication with an anode connecting electrode 62 that extends in a normal or perpendicular relationship to the anode 18 and the cathode 28. The first conductive plating first end 44 is thus proximal to the anode connecting electrode 62. With the first insulator 58 being interposed between the inner wall of the anode connecting electrode 62 and the anode first end 20/cathode second end 32, the cathode 28 is isolated from the anode connecting electrode 62. As indicated above, the anode 18 is in electrical communication with the first conductive plating 38, which in turn is in electrical communication with the anode connecting electrode 62.

Similarly, the second conductive plating 48 is structurally contiguous and in electrical communication with a cathode connecting electrode 64 that extends in a normal or perpendicular relationship to the anode 18 and the cathode 28. The second conductive plating first end 54 is proximal to the cathode connecting electrode 64. With the second insulator 60 being interposed between the inner wall of the cathode connecting electrode 64 and the cathode first end 30/anode second end 22, the anode 18 is isolated from the cathode connecting electrode 64. The cathode 28 is in electrical communication with the second conductive plating 48, which in turn is in electrical communication with the cathode connecting electrode 64.

Referring back to FIG. 1, the capacitor 10 is comprised of a plurality of capacitor elements 12 that are stacked onto another. Separating each of the capacitor elements 12 are build-up layers 66. In the exemplary embodiment of the capacitor 10 with five capacitor elements, there is a first intermediate build-up layer 66a between the first capacitor element 12a and the second capacitor element 12b, a second intermediate build-up layer 66b between the second capacitor element 12b and the third capacitor element 12c, a third intermediate build-up layer 66c between the third capacitor element 12c and the fourth capacitor element 12d, and a fourth intermediate build-up layer 66d between the fourth capacitor element 12d and the fifth capacitor element 12e. Each of the intermediate build-up layers 66a-66d may have a generally planar configuration extending between the inner walls of the anode connecting electrode 62 and the cathode connecting electrode 64, and adjacent to the bottom conductive plating surface 42 of one capacitor element 12 and the top conductive plating surface 52 of the next one immediately underneath. Above the first capacitor element 12a is a top build-up layer 68, and below the fifth capacitor element 12e is a bottom build-up layer 70. All of the aforementioned build-up layers may be an electrically insulating polymer sheet or film, which may optionally be Ajinomoto® Buildup Film. Generally, the build-up layer may be modified epoxy, glass-reinforced pre-preg materials commonly utilized in printed circuit board constructions.

According to one embodiment, the anode connecting electrode 62 of each of the capacitor elements 12a-12e may be connected to define a contiguous anode electrode 72 that extends vertically along the right side of the overall structure of the capacitor 10. Similarly, the cathode connecting electrode 64 of each of the capacitor elements 12a-12e may be connected to define a contiguous cathode electrode 74 that extends along the left side of the overall structure of the capacitor 10. The anode connecting electrode 62 and the cathode connecting electrode 64 may be considered as being defined by multiple segments when considered in the context of single capacitor element in the overall stack, but according to various embodiments, the segments may be combined into a single unitary structure. With the first conductive plating 38 on each of the anodes 18 extending to the anode electrode 72 but not the second conductive plating 48, the cathodes 28 remain isolated from the anodes 18/anode electrode 72. Likewise, with the second conductive plating 48 on each of the cathodes 28 extending to the cathode electrode 74 but not the first conductive plating 38, the anodes 18 remain isolated from the cathodes 28/cathode electrode 74.

The top build-up layer 68 defines a top surface 76, along which there may extend a top anode terminal segment 78 that is structurally contiguous with the anode electrode 72, as well as a top cathode terminal segment 80 that that is structurally contiguous with the cathode electrode 74. Neither are understood to extend the entire width of the capacitor 10, and so there may be a top opening 82 defined by the inner extent of the top anode terminal segment 78 and the top cathode terminal segment 80.

Similar features are contemplated for the bottom portion of the capacitor 10, with a bottom surface 86 being defined by the bottom build-up layer 70. There may be a bottom anode terminal segment 88 that is structurally contiguous with the anode electrode 72, and a bottom cathode terminal segment 90 that is structurally contiguous with the cathode electrode 74. Like the top anode and cathode terminal segments 78, 80, the bottom anode and cathode terminal segments 88, 90 may not extend the entire width of the capacitor 10. These terminal segments may together define a bottom opening 92.

Figure 3:
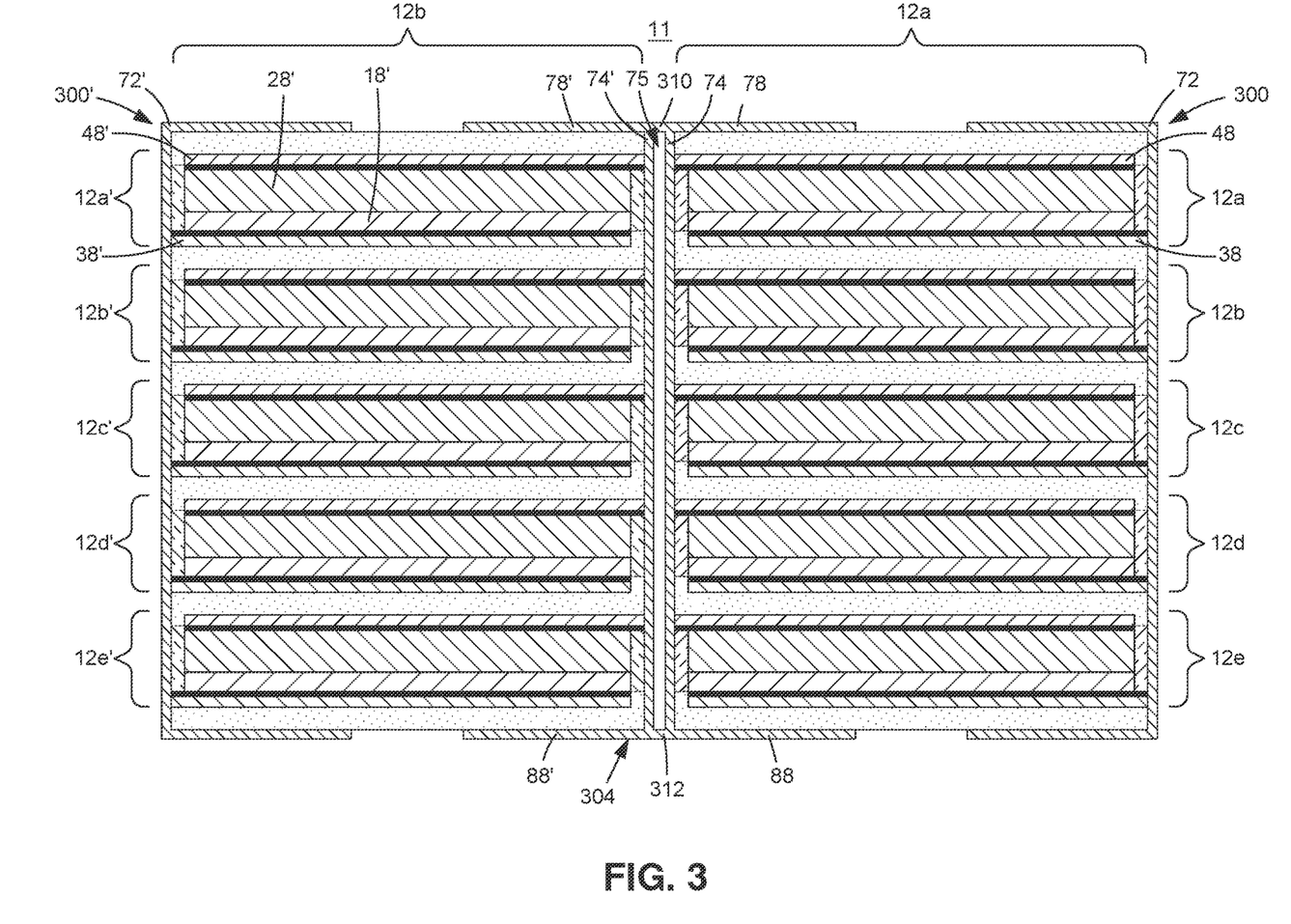
FIG. 3 is a cross-sectional view of an exemplary stacked staggered electrode foil capacitor according to another embodiment of the present disclosure.

In the foregoing embodiment, the anode 18 and the cathode 28 of each of the capacitor elements 12 have common connections due to the structurally and electrically contiguous anode electrode 72 and the structurally and electrically contiguous cathode electrode 74. An additional embodiment suitable for servicing multiple independent voltage domains in an integrated passive device (IPD) is also contemplated. As best shown in FIG. 3, though with additional reference to FIG. 2, a capacitor 11 may be comprised of a first capacitor block 10a and a second capacitor block 10b. The first capacitor block 10a largely corresponds to the capacitor 10 as described above, and includes the capacitor elements 12a-12e. Each of these capacitor elements 12 are configured with the second conductive plating 48 extending to the cathode electrode 74, while stopping short of the anode electrode 72. The first conductive plating 38 of each of the capacitor elements 12, on the other hand, extend to the anode electrode 72 while stopping short of the cathode electrode 74.

The second capacitor block 10b, on the other hand, is horizontally mirrored with respect to the staggering of the cathode and anode terminals. In further detail, the second capacitor block 10b is comprised of capacitor elements 12', including a first capacitor element 12'a, a second capacitor element 12'b, a third capacitor element 12'c, a fourth capacitor element 12'd, and a fourth capacitor element 12'e. Each of the capacitor elements 12' are understood to include a first conductive plating 38' (connected to the cathode 18') that extends to an anode electrode 72' but does not extend to a cathode electrode 74', as well as a second conductive plating 48' (connected to the cathode 28') that extends to the cathode electrode 74' but does not extend to the anode electrode 72'.

The anode electrode 72 of the first capacitor block 10a is located on a right side 300 of the capacitor 11, and the cathode electrode 74 of the first capacitor block 10a is located in a rightward central region 302. The cathode electrode 74' of the second capacitor block 10b is located in a leftward central region 304, while the anode electrode 72' of the second capacitor block 10b is located on a left side 306 of the capacitor 11. Thus, the cathode electrode 74 of the first capacitor block 10a is adjacent to the cathode electrode 74' of the second capacitor block 10b, and are electrically contiguous with each other. In other words, the first capacitor block 10a shares a common cathode with the second capacitor block 10b, while the anode electrode 72 of the first capacitor block 10a remains isolated from the anode electrode 72' of the second capacitor block 10b. In this configuration, the first capacitor block 10a and the second capacitor block 10b may service independent voltage domains in a single arrayed integrated passive device.

There may also be a gap 75 defined between the cathode electrode 74 of the first capacitor block 10a and the cathode electrode 74' of the second capacitor block 10b, with the structural and electrical connections between the two being established over a top terminal bridge 310 and a bottom terminal bridge 312. The top terminal bridge 310 may connect the top cathode terminal segment 78 of the first capacitor block 10a and a top cathode terminal segment 78' of the second capacitor block 10b. The bottom terminal bridge 312 may connect the bottom cathode terminal segment 88 of the first capacitor block 10a and a bottom cathode terminal segment 88' of the second capacitor block 10b.

Figure 4A:
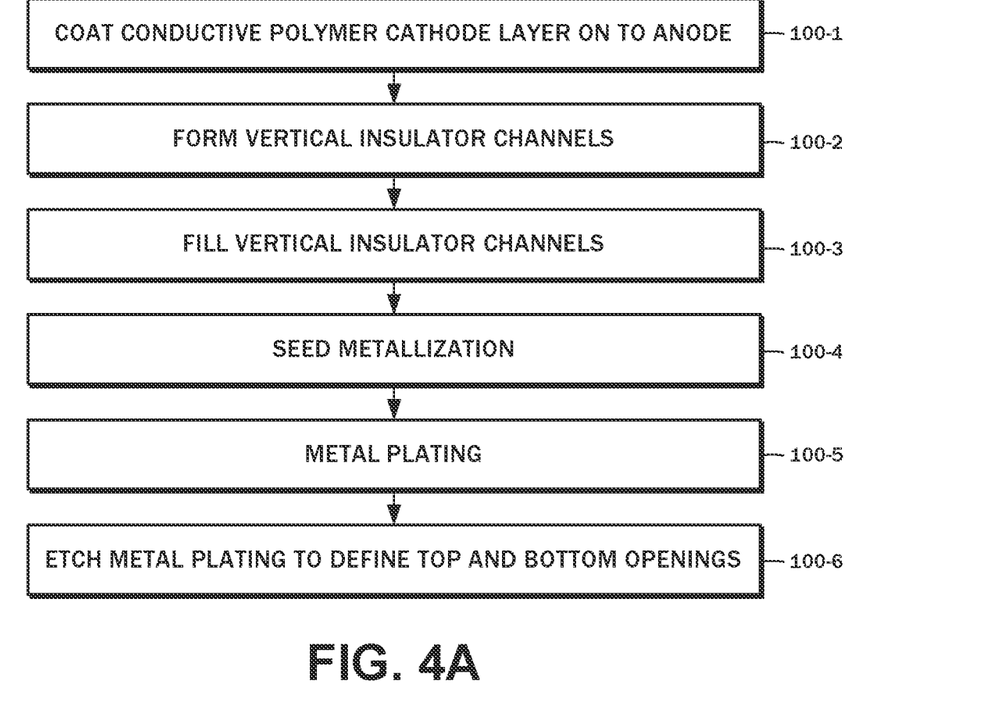
FIG. 4A is a flowchart illustrating a first part of a method for fabricating the stacked staggered electrode foil capacitor according to an embodiment of the present disclosure.
Figure 5A:
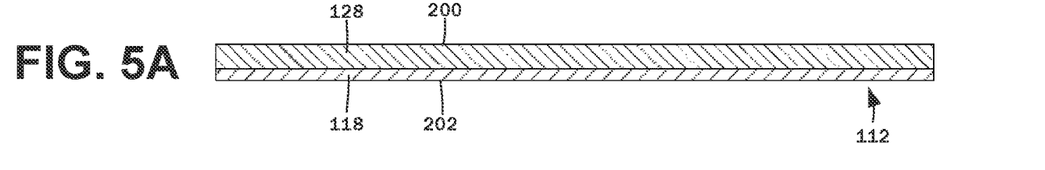
FIGS. 5A-5G are cross-sectional views of a capacitor core assembly at various stages of fabrication.
Figure 5B:
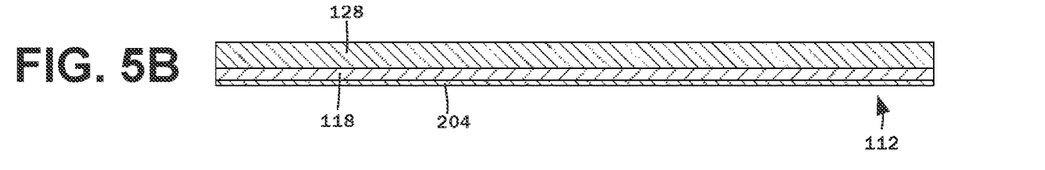

The embodiments of the stacked staggered electrode foil capacitor 10 may be fabricated in accordance with various methods, with a portion of one such method being shown in the flowchart of FIG. 4A. The cross-sectional views of FIGS. 5A-5G illustrate the capacitive element 12 in various stages of completion as corresponding to the specific steps of the method. The method begins with a step 100-1 of coating a conductive polymer cathode layer 128 on to a planar anode sheet 118 to form a capacitor core assembly 112. Upon completion, the conductive polymer cathode layer 128 becomes the cathode 28, the planar anode sheet 118 becomes the anode 18, and the capacitor core assembly 112, with the addition of further components, becomes the capacitor element 12. The details of the anode 18, the cathode 28, and the capacitor element 12 generally, including its structural and material parameters have been discussed above. Accordingly, such details will be omitted for the sake of brevity. The capacitor core assembly 112 defines an assembly top surface 200 that corresponds to the cathode 28 and an assembly bottom surface 202 that corresponds to the anode 18. FIG. 5A illustrates the capacitor core assembly 112 after completion of the step 100-1. As best shown in FIG. 5B, the capacitor core assembly 112 may be mounted to a frame 204 to enable the next step in the fabrication process.

Figure 5C:
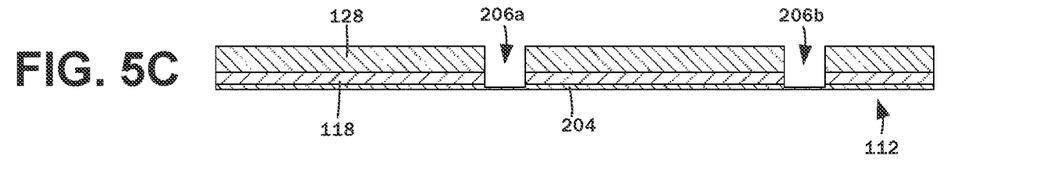

The method continues with a step 100-2 of forming one or more vertical insulator channels 206. As depicted in FIG. 5C, there may be a first vertical insulator channel 206 and a second vertical insulator channel 206. It is to be understood that the cross-sectional views of FIGS. 5A-5G are excerpts of a section of the capacitor core assembly 112. In practice, the constituent sheets of material may extend to arbitrary widths, thicknesses, and other dimensions, so there may be additional vertical insulator channels 206 spaced across the capacitor core assembly 112. Those having ordinary skill in the art will appreciate any restrictions imposed by existing or future tooling and processes. The vertical insulator channels 206 extend through the planar anode sheet 118 and the conductive polymer cathode layer 128, but not the frame 204.

Figure 5D:
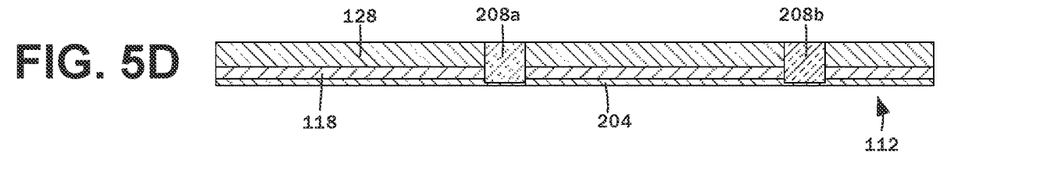

Next, in a step 100-3, the method involves filling the vertical insulator channels 206 with an insulator epoxy material. As shown in FIG. 5D, with there being the first vertical insulator channel 206a and the second vertical insulator channel 206b, following completion of the step 100-3, there is a corresponding insulator epoxy section 208a and an insulator epoxy section 208b. The height of the insulator epoxy sections 208 is understood to be the same as the planar anode sheet 118 and the conductive polymer cathode layer 128 combined.

Figure 5E:
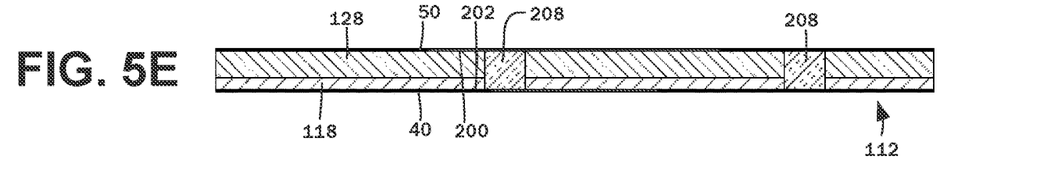

Following the fabrication of the insulator epoxy sections 208, the method continues with a seed metallization step 100-4 that prepares the planar anode sheet 118 and the conductive polymer cathode layer 128 to accept the copper or other metal plating. FIG. 5E depicts the cathode conductive seed layer 50 that is formed on the assembly top surface 200 corresponding to the conductive polymer cathode layer 128 and the anode conductive seed layer 40 that is formed on the assembly bottom surface 202 corresponding to the planar anode sheet 118. The anode conductive seed layer 40 may be referred to as a seeded anode metal layer and the cathode conductive seed layer 50 may be referred to as a seeded cathode metal layer.

Figure 5F:
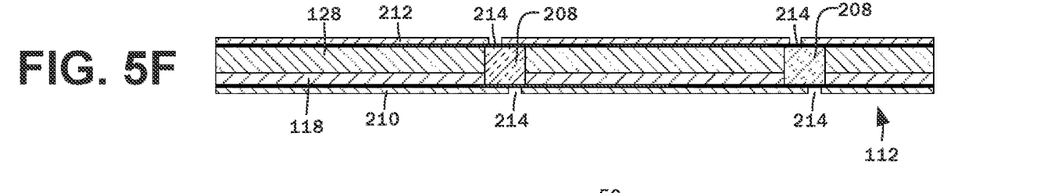

Upon completing the seed metallization step, the method proceeds to a metal plating step 100-5 that forms an anode electrode plating 210 on the anode conductive seed layer 40 and a cathode electrode plating 212 on the cathode conductive seed layer 50. The anode electrode plating 210 is understood to correspond to the first conductive plating 38 discussed in the context of the structural features of the capacitor elements 12 discussed above. Similarly, the cathode electrode plating 212 corresponds to the second conductive plating 48. Broad boundaries between different segments of the conductive plating may be established around the insulator epoxy sections 208, with plating gaps 214 being present in the resulting capacitor core assembly 112.

Figure 5G:
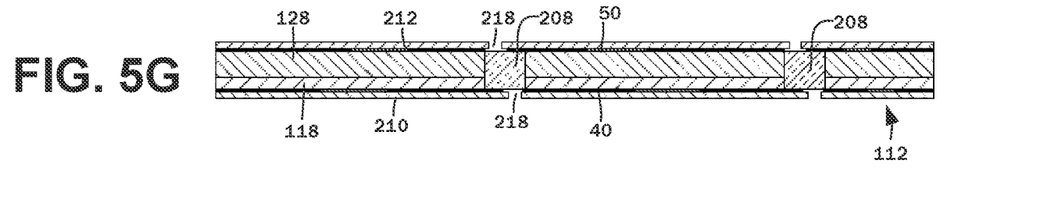

The method continues with a step 100-6 of etching the metal plating, e.g., the anode electrode plating 210 and the cathode electrode plating 212 to further define the staggered relationship. As a result, a further bottom opening 216 may be defined along the bottom face of the capacitor core assembly 112, as well as a top opening 218 that is defined along the top face. The opening 216 extends through the anode conductive seed layer 40 to the insulator epoxy section 208, while the opening 218 extends through the cathode conductive seed layer 50 likewise to the insulator epoxy section 208. The bottom and top openings 216, 218 are laterally offset from each other, such that the anode electrode plating 210 is staggered relative to the cathode electrode plating 212.

Figure 4B:
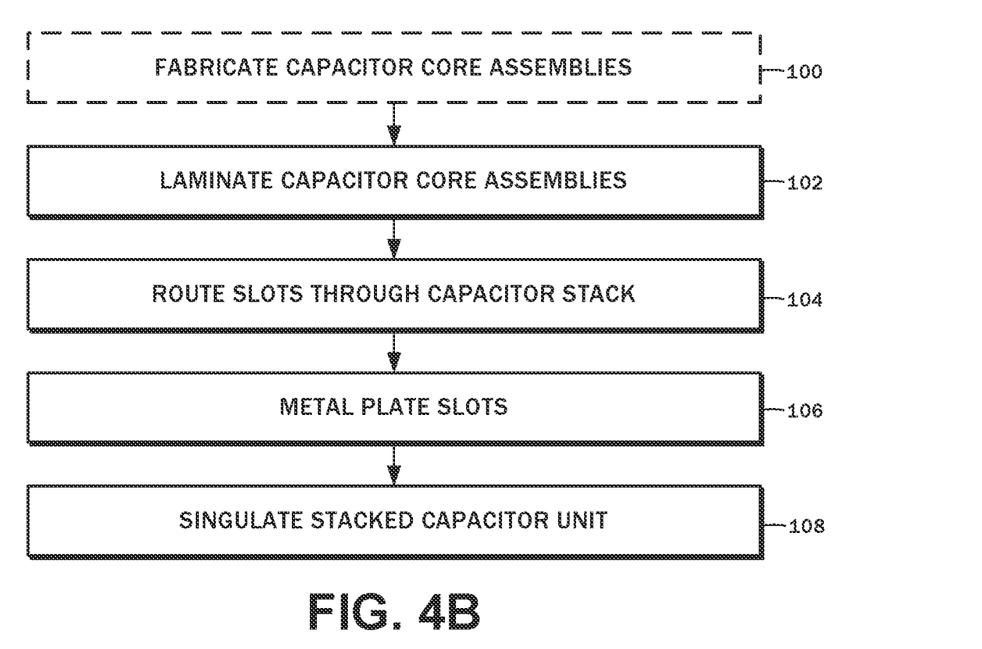
FIG. 4B is a flowchart illustrating a second part of the method for fabricating the stacked staggered electrode foil capacitor.

The foregoing steps are directed to fabricating one capacitor core assembly 112. The method for fabricating the staggered electrode stacked capacitor 10 further includes assembling multiple capacitor core assemblies 112, the steps for which are shown in the flowchart of FIG. 4B. The step 100 of fabricating the capacitor core assembly 112 consolidates the steps 100-1 to 100-6 described above, and then proceeds to a lamination step 102.

Figure 6A:
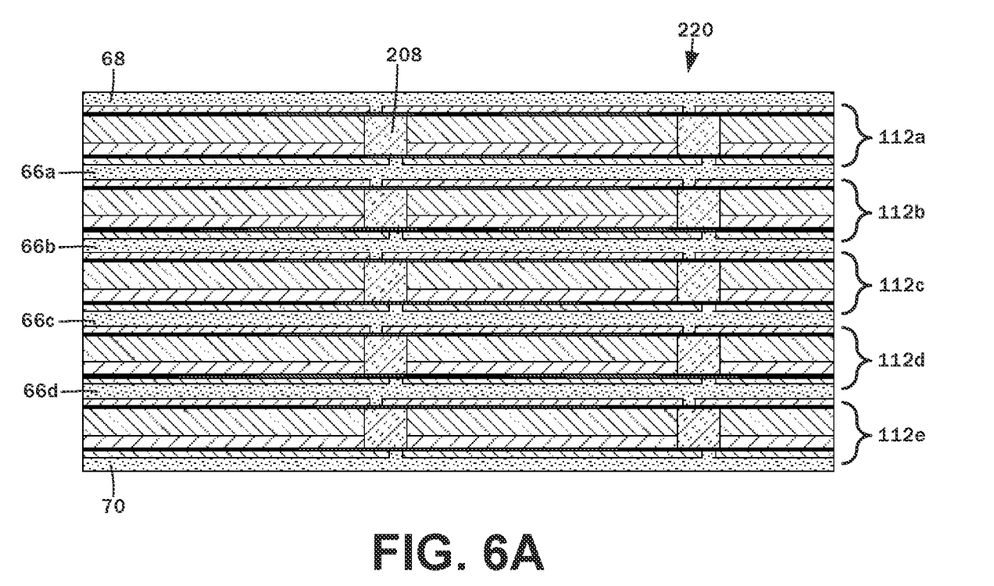
FIGS. 6A-6D are cross-sectional views of a stacked staggered electrode capacitor at various stages of fabrication following the stacking of multiple capacitor core assemblies.

In the illustrated example, five capacitor core assemblies 112 are stacked atop each other, including a first capacitor core assembly 112a, a second capacitor core assembly 112b, a third capacitor core assembly 112c, a fourth capacitor core assembly 112d, and a fifth capacitor core assembly 112e. Interposed between each capacitor core assembly 112 are build-up layers 66, 68, 70. Again, atop the first capacitor core assembly 112a is the top build-up layer 68, and under the fifth capacitor core assembly 112e is the bottom build-up layer 70. Between the first capacitor core assembly 112a and the second capacitor core assembly 112b is the first intermediate build-up layer 66a, between the second capacitor core assembly 112b and the third capacitor core assembly 112c is the second intermediate build-up layer 66b, between the third capacitor core assembly 112c and the fourth capacitor core assembly 112d is the third intermediate build-up layer 66c, and between the fourth capacitor core assembly 112d and the fifth capacitor core assembly 112e is the fourth intermediate build-up layer 66d. The lamination process may begin from the bottom build-up layer 70 and stacking the fifth capacitor core assembly 112e, then the fourth intermediate build-up layer 66d, and so forth. Other embodiments may involve the reverse, beginning with the top build-up layer 68 and fixing the first capacitor core assembly 112a onto the top build-up layer 66, and so on. Still other embodiments may involve alternatively stacking on top of and below a given one of the capacitor core assemblies 112 and build-up layers 66, 68, and 70. At the conclusion of the lamination step 102, a capacitor stack 220 results.

Figure 6B:
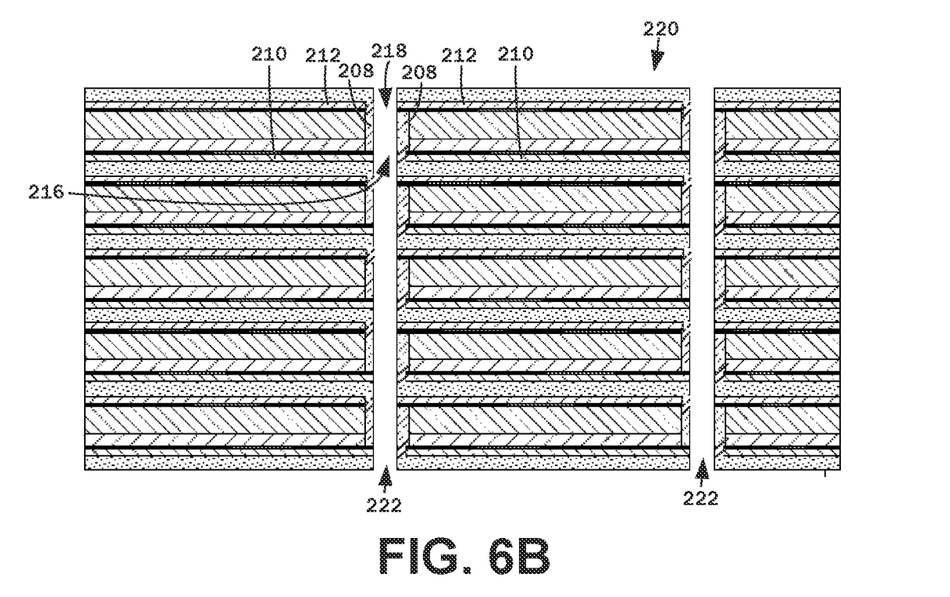

Referring back to the flowchart of FIG. 4B as well as the cross-sectional view of FIG. 6B, the method continues with a step 104 of routing slots 222 through the capacitor stack 220. Preferably, though optionally, the slot 222 extends through the center of the insulator epoxy section 208, with an equal length of the anode electrode plating 210 on one side of the slot 222 and the cathode electrode plating 212 on the other side of the slot 222 remaining underneath and below, respectively, the insulator epoxy section 208. In general, the slots 222 are at least partially coextensive with the bottom opening 216 and the top opening 218 of the capacitor core assemblies 112. The slots 222 may also be vias, and accordingly may have any cross-sectional profile.

Figure 6C:
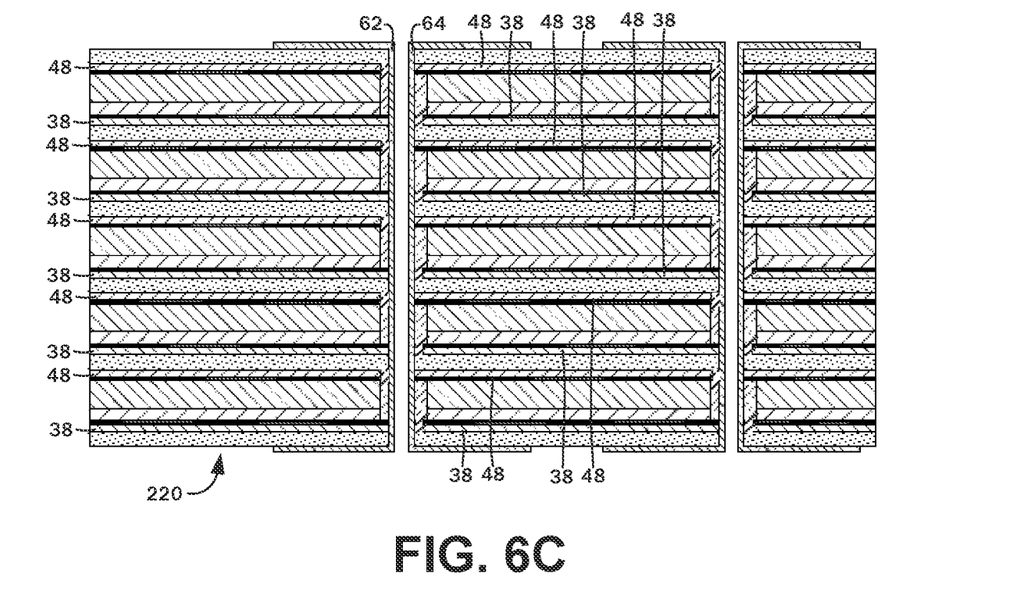

After the slots 222 are routed in accordance with step 104, the method continues with a step 106 of metal plating the same. As best shown in FIG. 6C, this plating process forms the anode connecting electrode 62, which connects to the first conductive plating 38 of each of the capacitor core assemblies 112, as they extend beyond the limits of the second conductive plating 48. The plating process also forms the cathode connecting electrode 64 that connects to the second conductive plating 48 of each of the capacitor core assemblies 112. The slot 222 is understood to be bounded by a left wall that corresponds to the anode connecting electrode 62, and a right wall that corresponds to the cathode connecting electrode 64.

Figure 6D:
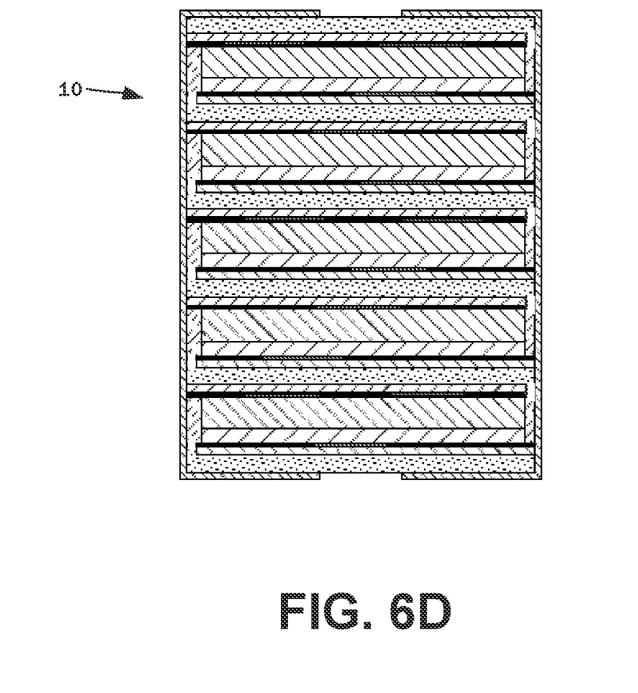

The method concludes with a step 108 of singulating the staggered electrode stacked capacitor 10 from the others in the capacitor stack 220.

Figure 7:
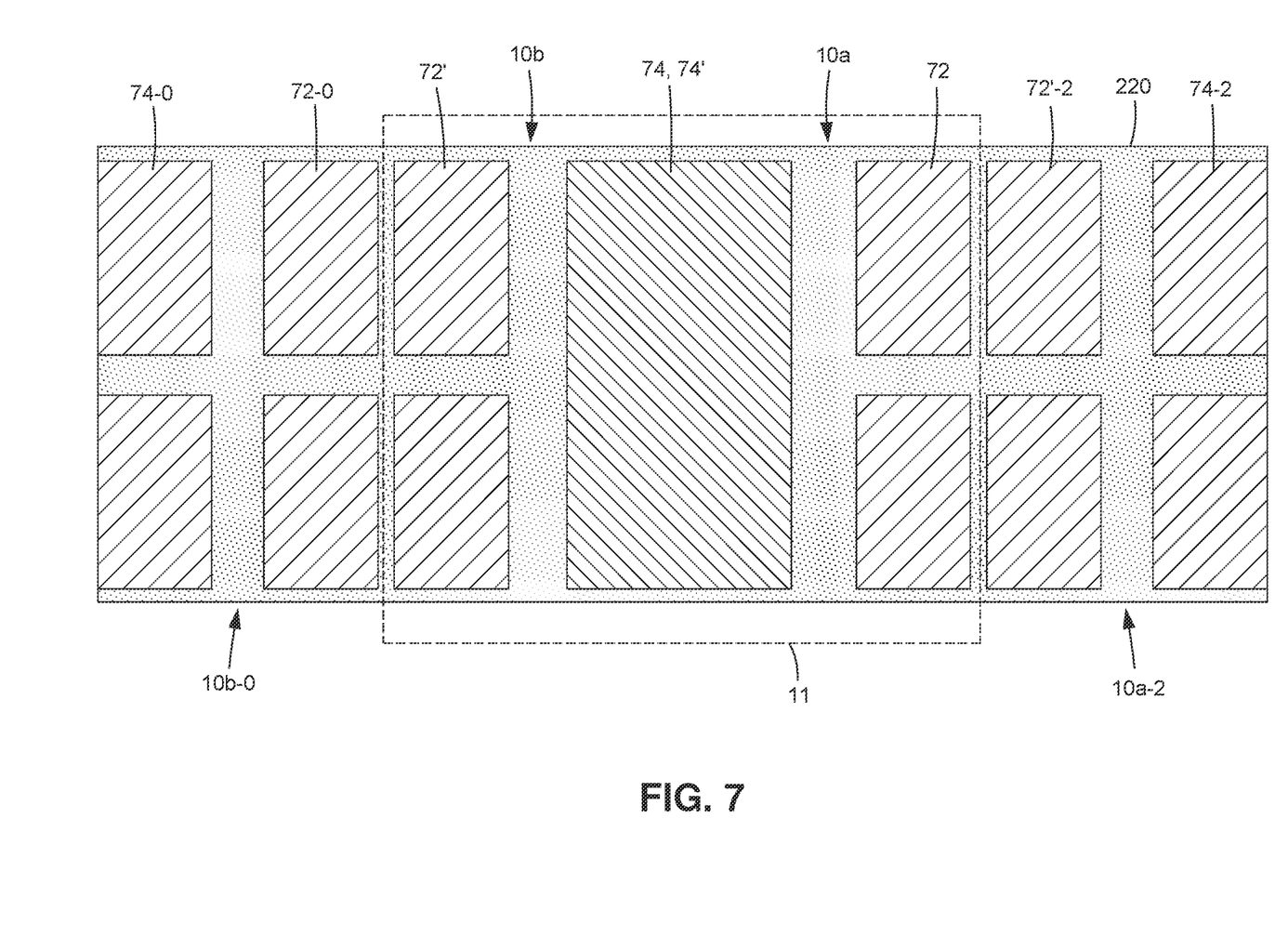
FIG. 7 is a simplified cross-sectional view of another embodiment of the stacked staggered electrode capacitor at a stage of fabrication after connecting terminals have been formed.
Figure 8:
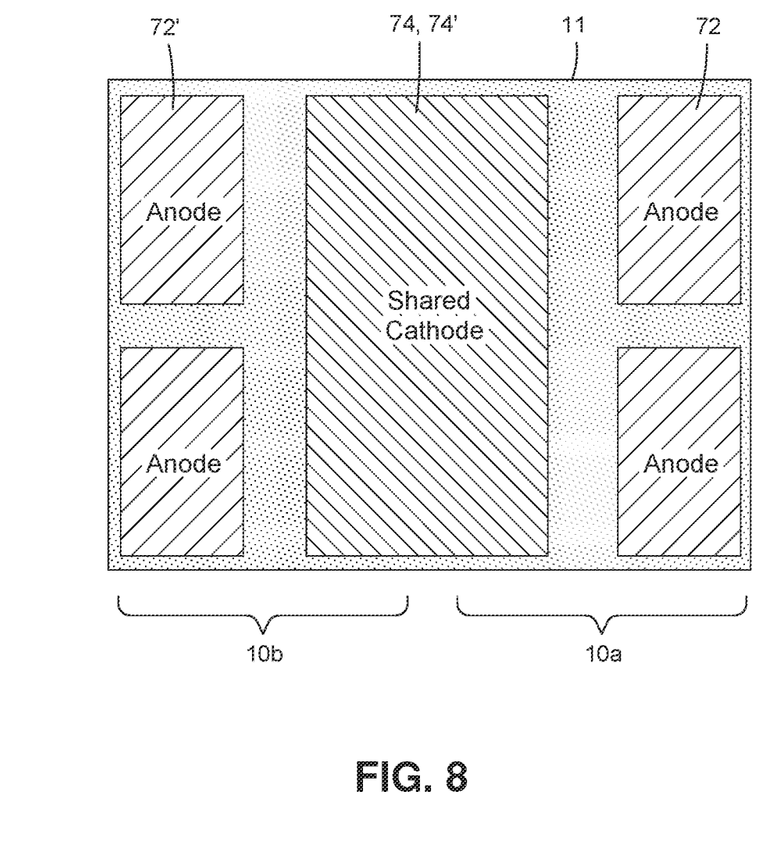
FIG. 8 is a simplified cross-sectional view of the stacked staggered electrode capacitor shown in FIG. 7 after singulation.

In an alternative embodiment, the fabrication method may yield the capacitor 11 with independent anodes and a shared cathode. The step 100-6 of etching the metal plating discussed above with reference to FIG. 5F, 5G may be modified for a pattern in which the staggering of the anode electrode plating 210 and the cathode electrode plating 212 on one (center) pair of capacitor core assemblies 112 is reoriented so that the cathode terminals 74 are back-to-back in neighboring capacitor blocks 10. FIG. 7 is a simplified cross sectional view of the capacitor stack 220, showing the shared cathode terminal 74, 74', the anode terminal 74 of the first capacitor block 10a and the anode terminal 74' of the second capacitor block 10b.

During the manufacturing process, multiple capacitors 11 are understood to be fabricated on a single capacitor stack 220. Thus, there may be an anode terminal 72' of another adjacent one of the second capacitor blocks 10b that is spaced apart from the anode terminal 72. In the illustrated example, this anode terminal 72'-2 is disposed to the right of the anode terminal 72. Likewise, there may be an anode terminal 72-0 of another adjacent one of the first capacitor blocks 10b spaced apart from the anode terminal 72'. Specifically, this anode terminal 72-0 is disposed to the left of the anode terminal 72'. FIG. 7 also depicts the cathode terminal 74-0 of this other second capacitor block 10b-0, and the cathode terminal 74-2 of the other first capacitor block 10a-2.

The method continues with a step 100-6 of etching the metal plating, e.g., the anode electrode plating 210 and the cathode electrode plating 212 to further define the staggered relationship. As a result, a further bottom opening 216 may be defined along the bottom face of the capacitor core assembly 112, as well as a top opening 218 that is defined along the top face. The opening 216 extends through the anode conductive seed layer 40 to the insulator epoxy section 208, while the opening 218 extends through the cathode conductive seed layer 50 likewise to the insulator epoxy section 208. The bottom and top openings 216, 218 are laterally offset from each other, such that the anode electrode plating 210 is staggered relative to the cathode electrode plating 212.

FIG. 11 illustrates the terminals of the capacitor 11 after singulation, including the shared cathode terminal 74, 74', as well as the independent anodes 72 and 72'. As described above, the cathode terminal 74 and the anode 72 are a part of the first capacitor block 10a, and the cathode terminal 74' and the anode 72' are a part of the second capacitor block 10b.

The fabricated capacitors 10, 11 are envisioned to have a high electrode area density, and as a consequence, high electrode efficiency. Along these lines, the capacitors 10, 11 have high volumetric capacitive density and increased stacked element density, particularly in comparison to earlier foil-based capacitors. As indicated above, the copper electrodes and interconnects yield low equivalent series resistance overall, along with high reliability and low resistance with respect to electrode and terminal connections. The staggered electrode stacked capacitors 10, 11 are well-suited for embedding in packaging substrate core structures, particularly integrated passive devices capable of handling multiple voltage domains. It is expressly contemplated that the capacitors 10, 11 in accordance with various embodiments of the present disclosure may be incorporated into high performance compute applications such as in data centers, artificial intelligence/deep learning integrated circuits, graphic processing units, field programmable gate array (FPGA) circuits, analog and radio frequency (RF) power and filter architectures, electric vehicle power architectures, and other electric motor driver applications. The integration of the capacitive elements closer to the serviced load, as would be possible with the devices in accordance with the present disclosure, is envisioned to increase power efficiency, increase system performance, and reduce thermal loading.

The particulars shown herein are by way of example and for purposes of illustrative discussion of the embodiments of the stacked staggered electrode foil capacitor structures and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A stacked staggered electrode capacitor, comprising:
   an anode defined by an anode first end and an opposed anode second end;
   a cathode vertically disposed relative to the anode and defined by a cathode first end substantially coterminous with the anode second end, and an opposed cathode second end substantially coterminous with the anode first end;
a first conductive plating on the anode and extending from beyond the anode first end toward the anode second end;
a second conductive plating on the cathode and extending from beyond the cathode second end toward the cathode first end, the second conductive plating being in a staggered relationship relative to the first conductive plating;
an anode conductive seed layer disposed between the anode and the first conductive plating; and
a cathode conductive seed layer disposed between the cathode and the second conductive plating.

2. The stacked staggered electrode capacitor of claim 1, wherein the first conductive plating and the second conductive plating are copper.

3. The stacked staggered electrode capacitor of claim 1, further comprising:
an anode connecting electrode structurally contiguous with the first conductive plating and extending normally thereto, the anode connecting electrode being proximal to the anode first end; and
a cathode connecting electrode structurally contiguous with the second conductive plating and extending normally thereto, the cathode connecting electrode being proximal to the cathode first end.

4. The stacked staggered electrode capacitor of claim 3, further comprising:
a first insulator adjacent to the anode first end and the cathode second end; and
a second insulator adjacent to the anode second end and the cathode first end.

5. The stacked staggered electrode capacitor of claim 4, wherein the first insulator is adjacent to the anode connecting electrode and the second insulator is adjacent to the cathode connecting electrode.

6. The stacked staggered electrode capacitor of claim 4, wherein the first insulator and the second insulator are an epoxy material.

7. A stacked staggered electrode capacitor, comprising:
a plurality of capacitor elements each with a cathode disposed vertically relative to an anode, an anode conductive plating on the anode and a cathode conductive plating on the cathode, the anode conductive plating being in a laterally offset relationship to the cathode conductive plating, the plurality of capacitor elements being stacked onto another;
one or more build-up layers each interposed between one of the plurality of capacitor elements and a vertically adjacent one of the plurality of capacitor elements;
one or more anode connecting electrode segments on a first side of the plurality of capacitor elements;
a cathode connecting electrode on an opposed second side of the plurality of capacitor elements connected to the cathode conductive plating of each of the plurality of capacitor elements;
an anode conductive seed layer disposed between the anode and the anode conductive plating; and
a cathode conductive seed layer disposed between the cathode and the cathode conductive plating.

8. The stacked staggered electrode capacitor of claim 7, wherein a given one of the one or more anode connecting electrode segments is connected to the anode conductive plating of at least one of the plurality of capacitor elements.

9. The stacked staggered electrode capacitor of claim 7, wherein given ones of the one or more anode connecting electrode segments are each connected to the anode conductive plating of a respective one of the plurality of capacitor elements.

10. The stacked staggered electrode capacitor of claim 9, wherein sequential ones of the one or more anode connecting electrode segments are connected and extend in an orientation normal to the anode conductive plating.

11. The stacked staggered electrode capacitor of claim 7, wherein each of the capacitor elements includes a first insulator adjacent to the one or more anode connecting electrode segments and a second insulator adjacent to the cathode connecting electrode.

12. The stacked staggered electrode capacitor of claim 11, wherein the first insulators and the second insulators are an epoxy material.

13. The stacked staggered electrode capacitor of claim 7, wherein the anode conductive plating and the cathode conductive plating are copper.

14. A stacked staggered electrode capacitor, comprising:
a plurality of anodes;
a plurality of cathodes, a given one of the cathodes being vertically disposed relative to a given one of the plurality of anodes;
a plurality of anode conductive plating segments on each of the anodes;
a plurality of cathode conductive plating segments on each of the cathodes, each being in a horizontally staggered relationship to a respective one of the anode conductive plating segments;
an anode connecting electrode connected to each of anode conductive plating segments;
a cathode connecting electrode connected to each of the cathode conductive plating segments;
a plurality of anode conductive seed layers disposed between given ones of the anodes and the corresponding first conductive plating segments connected thereto; and
a cathode conductive seed layer disposed between given ones of the cathodes and the corresponding second conductive plating segments connected thereto.

15. The stacked staggered electrode capacitor of claim 14, wherein each of the anode conductive plating segments extend beyond the anodes and cathodes in a first direction, and each of the cathode conductive plating segments extend beyond the anodes and cathodes in a second direction opposite the first direction.

16. The stacked staggered electrode capacitor of claim 15, wherein the anode connecting electrode is on a first side of the cathodes and anodes, and the cathode electrode is on a second side of the cathodes and anodes opposite the first side.

17. The stacked staggered electrode capacitor of claim 14, further comprising:
a plurality of build-up layers each interposed between one of the anode connecting electrodes and an adjacent one of the cathode connecting electrodes.

18. The stacked staggered electrode capacitor of claim 14, further comprising:
a plurality of first insulators adjacent to the anode connecting electrode; and
a plurality of second insulators adjacent to the cathode connecting electrode.

* * * * *